United States Patent
Yen et al.

(10) Patent No.: US 10,295,114 B2
(45) Date of Patent: May 21, 2019

(54) SUPPORTING MODULE

(71) Applicant: SYNCMOLD ENTERPRISE CORP., New Taipei (TW)

(72) Inventors: Ching-Hui Yen, New Taipei (TW); Jen-Yi Lee, New Taipei (TW); Ming-Chih Shih, New Taipei (TW)

(73) Assignee: SYNCMOLD ENTERPRISE CORP., New Taipei (TW)

( * ) Notice: Subject to any disclaimer, the term of this patent is extended or adjusted under 35 U.S.C. 154(b) by 0 days.

(21) Appl. No.: 15/933,103

(22) Filed: Mar. 22, 2018

(65) Prior Publication Data

US 2018/0372265 A1  Dec. 27, 2018

Related U.S. Application Data

(60) Provisional application No. 62/524,716, filed on Jun. 26, 2017.

(51) Int. Cl.
*F16M 13/02* (2006.01)
*H05K 5/02* (2006.01)
*F16H 25/24* (2006.01)
*H05K 5/00* (2006.01)

(52) U.S. Cl.
CPC ......... *F16M 13/02* (2013.01); *F16H 25/2454* (2013.01); *H05K 5/0234* (2013.01); *F16M 2200/044* (2013.01); *F16M 2200/06* (2013.01); *H05K 5/0017* (2013.01)

(58) Field of Classification Search
USPC ...................................................... 248/578
See application file for complete search history.

(56) References Cited

U.S. PATENT DOCUMENTS

| 1,790,500 | A | * | 1/1931 | Fischer | F21V 21/32 131/225 |
| 4,842,174 | A | * | 6/1989 | Sheppard | B60R 11/02 108/45 |
| 5,845,885 | A | * | 12/1998 | Carnevali | F16M 11/14 248/181.1 |
| 7,392,965 | B2 | * | 7/2008 | Jung | F16M 11/125 248/125.2 |
| 7,421,762 | B2 | * | 9/2008 | Lu | F16M 11/10 16/328 |

(Continued)

FOREIGN PATENT DOCUMENTS

TW  M450918 U  4/2013

*Primary Examiner* — Monica E Millner
(74) *Attorney, Agent, or Firm* — Muncy, Geissler, Olds & Lowe, P.C.

(57) ABSTRACT

Disclosed is a supporting module for a display device, which includes a fixing seat, a pivot lever, a slider and a spring. The pivot lever and the slider constitute a screw transmission mechanism. The pivot motion of the pivot lever can cause screw motion between the pivot lever and the slider and thus induces the linear movement of the slider with respect to the pivot lever. Accordingly, the displacement of the slider causes different degrees of deformation in the spring, resulting in different spring resilience forces on the slider. By the screw transmission mechanism, the different spring resilience forces can be further converted into different resistance torques to balance with the downward torque caused by the weight of the display device. As a result, the display device can stopped at any desired height.

17 Claims, 8 Drawing Sheets

(56) References Cited

U.S. PATENT DOCUMENTS

| | | | | |
|---|---|---|---|---|
| 7,584,933 B2* | 9/2009 | Chih | F16M 11/10 | 248/176.1 |
| 7,673,844 B2* | 3/2010 | Zhang | F16M 11/10 | 16/337 |
| 7,810,773 B2* | 10/2010 | Chi | F16M 11/2064 | 248/121 |
| 7,861,998 B2* | 1/2011 | Huang | F16M 11/105 | 248/125.1 |
| 7,883,063 B2* | 2/2011 | Mesfin | F16M 11/24 | 248/123.11 |
| 8,046,874 B2* | 11/2011 | Cheng | F16M 11/10 | 16/324 |
| 8,226,054 B2* | 7/2012 | Chen | F16M 11/10 | 16/337 |
| 8,256,725 B2* | 9/2012 | Wang | F16M 11/105 | 248/133 |
| 8,672,277 B2* | 3/2014 | Hsu | F16M 11/10 | 248/121 |
| 8,702,046 B2* | 4/2014 | Cooper | B60R 11/02 | 108/141 |
| 8,870,142 B2* | 10/2014 | Wang | F16M 13/022 | 16/324 |
| 9,004,431 B2* | 4/2015 | Huang | F16M 11/10 | 248/121 |
| 9,857,020 B2* | 1/2018 | Yeh | F16M 11/046 | |
| 9,936,593 B2* | 4/2018 | Deily | F16M 11/10 | |
| 2005/0205734 A1* | 9/2005 | Wang | F16M 11/2064 | 248/276.1 |
| 2006/0118680 A1* | 6/2006 | Yen | F16M 11/24 | 248/121 |
| 2008/0017782 A1* | 1/2008 | Chiu | F16M 11/10 | 248/676 |
| 2008/0237414 A1* | 10/2008 | Lien | F16M 11/10 | 248/125.2 |

* cited by examiner

SUPPORTING MODULE

CROSS REFERENCE TO RELATED APPLICATION

This application claims the benefit of U.S. Provisional Application Ser. No. 62/524,716 filed Jun. 26, 2017. The entirety of said Provisional Application is incorporated herein by reference.

BACKGROUND OF THE INVENTION

1. Field of the Invention

The present invention relates to a supporting module and, more particularly, to a supporting module capable of converting spring resilience force into resistance torque.

2. Description of Related Art

A conventional supporting device typically includes a fixing seat, a connecting arm and a swivel joint. The connecting arm has one end for mounting a screen and the other end pivotally attached to the fixing seat by the swivel joint. Accordingly, the connecting arm can pivot with respect to the fixing seat for adjustment of the screen height. For balancing with the downward torque caused by the screen weight, the swivel joint generally includes a torsion spring for providing a supporting torsion so that the screen can be stopped at any desired height with respect to the fixing seat. However, the supporting torsion offered by the torsion spring may be inadequate to balance with the downward torque caused by a heavier screen.

Disclosed in Taiwan Patent No. M450918 is a supporting device that includes a tension spring and a torsion spring to provide support force against the weight of the screen. The torsion spring provides torsion against the weight of the screen through a base and a main shaft, whereas the tension spring offers tension against the weight of the screen through the main shaft and a push-pull shaft. Although the disclosed supporting device addresses the issue that the torsion spring cannot provide adequate support for the heavier screen, its complicated configuration is unfavorable.

SUMMARY OF THE INVENTION

An objective of the present invention is to provide a supporting module for a display device, which is characterized by the combination of a screw transmission mechanism and a spring. The screw transmission mechanism is constituted by a pivot lever and a slider, and the linear movement of the slider would cause the spring to generate return force. By the screw transmission mechanism, the rectilinear return force can be transformed into axial resistance torque so as to provide adequate support against the weight of the display device. Accordingly, the display device can stopped at any desired height.

In accordance with the foregoing objective, the present invention provides a supporting module for a display device, the supporting module including: a fixing seat, having a guide structure, wherein the guide structure defines a linear path; a pivot lever, having a shaft and an arm, wherein (i) the shaft is rotatably connected to the fixing seat and has a central axis parallel to the linear path, (ii) the arm is connected to the shaft and used for mounting the display device, and (iii) the arm is configured to be pivotable about the central axis of the shaft and capable of bringing the shaft into rotary motion; a slider, being sleeved on the shaft, wherein a screw transmission mechanism is constituted by the slider and the shaft, and the slider is brought into linear movement along the linear path with respect to the shaft when the arm is forced to induce the rotary motion of the shaft; and a spring, having a mobile end and an immobile end, wherein the mobile end moves with the slider and the immobile end keeps stationary when the slider moves along the linear path, so that the linear movement of the slider causes different degrees of deformation in the spring, resulting in different spring resilience forces on the slider, and the different spring resilience forces are further converted into different resistance torques through the screw transmission mechanism so as to stop the display device at any desired height. Optionally, the supporting module may further include a sleeve that is sleeved on the shaft of the pivot lever and has an exterior surface abutting against an internal surface of the spring to avoid swaying of the spring.

In the supporting module of the present invention, the spring may be a tension spring, so that the spring can provide elastic force as adequate supporting force for balancing with the weight of the display device. Thereby, the display device can be stopped at any desired height, and the conventional issue that the torsion spring cannot provide adequate supporting torsion can be addressed. Specifically, when the display device mounted on the arm is lowered from a higher position to a horizontal position, the downward torque caused by the weight of the display device would increase due to the increased moment arm, and the spring provides larger supporting torque resulted from increased deformation of the spring by the displacement of the slider so as to balance the increased downward torque.

In the present invention, the shaft can be externally threaded, whereas the slider can be internally threaded. As a result, the shaft and the slider are threadedly connected with each other to constitute the screw transmission mechanism. However, the screw transmission mechanism of the present invention is not limited to the design of an external thread being threadedly engaged with an internal thread, and may be any other type of screw transmission mechanism.

In the present invention, the fixing seat preferably further has a base plate, a first lateral plate and a second lateral plate. The first lateral plate and the second lateral plate are erected on the base plate, and the shaft of the pivot lever extends through the first lateral plate, the slider, the spring and the second lateral plate in sequence. In a preferred embodiment of the present invention, the shaft of the pivot lever is rotatably connected to the first lateral plate and the second lateral plate, whereas the mobile end and the immobile end of the spring abut against the slider and the second lateral plate, respectively. More specifically, the slider can have a bearing face in contact with the mobile end of the spring, and the second lateral plate of the fixing seat can have an abutting face in contact with the immobile end of the spring. Preferably, each of the bearing face and the abutting face has a larger area than a cross-sectional area (in a plane normal to the central axis of the shaft) of the spring. As a result, the mobile end and the immobile and of the spring can firmly abut against the slider and the second lateral plate, respectively.

In the present invention, the slider may include a screwing part and a bearing plate. Accordingly, the shaft is threadedly connected with the screwing part and extends through the bearing plate, and the mobile end of the spring abuts against the bearing plate. Preferably, the cross-sectional area (in a plane normal to the central axis of the shaft) of the bearing plate is larger than that of the screwing part. Further, the screwing part and the bearing plate may be associated with each other by any other connecting means, or be integrated into one-piece component.

In the present invention, the guide structure of the fixing seat may include a first guide rod and a second guide rod that extend through the slider along a direction parallel to the central axis of the shaft and are connected to the second lateral plate. Accordingly, the slider can linearly move along the first guide rod and the second guide rod. More specifically, each of the first guide rod and the second guide rod may have a shaft portion and a head portion. The shaft portion extends through the slider and is connected to the second lateral plate. The head portion has a diameter larger than that of the shaft portion, so that the head portion can stop the slider departing from the first guide rod and the second guide rod in the direction toward the first lateral plate. Further, the first guide rod and the second guide rod may be affixed to the second lateral plate by nut-fixing manner. For instance, each of the first guide rod and the second guide rod may be provided with a nut, so that the shaft portions of the first guide rod and the second guide rod can be affixed with the second lateral plate of the fixing seat through the nuts. Additionally, in order to enhance the structural stability, the first guide rod and the second guide rod may further extend to and be connected to the first lateral plate of the fixing seat, whereas the head portions of the first guide rod and the second guide rod abut against the first lateral plate.

In the present invention, the fixing seat can further have a third lateral plate between the second lateral plate and the spring. In this case, the shaft, the first guide rod and the second guide rod extend through the third lateral plate, whereas the mobile end and the immobile end of the spring contact a bearing face of the slider and an abutting face of the third lateral plate, respectively. Preferably, the abutting face of the third lateral plate and the bearing face of the slider have a larger area than a cross-sectional area (in a plane normal to the central axis of the shaft) of the spring. As a result, the mobile end and the immobile end of the spring can firmly abut against the slider and the third lateral plate, respectively.

In the present invention, at least one of the first guide rod and the second guide rod preferably is rotatably connected to the first lateral plate and the second lateral plate and threadedly connected with the third lateral plate. Accordingly, the preload of the spring can be adjusted by rotating at least one of the first guide rod and the second guide rod to change the relative location of the third lateral plate on the first guide rod and the second guide rod. Alternatively, the distance between the slider and the second lateral plate can be changed by adjusting the relative location of the nuts on the first guide rod and the second guide rod so as to vary the preload of the spring according to requirement.

The foregoing and other objects, advantages, and novel features of the invention will become more apparent from the following detailed description when taken in conjunction with the accompanying drawings.

DETAILED DESCRIPTION OF THE PREFERRED EMBODIMENT

Hereafter, example will be provided to illustrate the embodiments of the present invention. Advantages and effects of the invention will become more apparent from the disclosure of the present invention. It should be noted that these accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Figure 1:
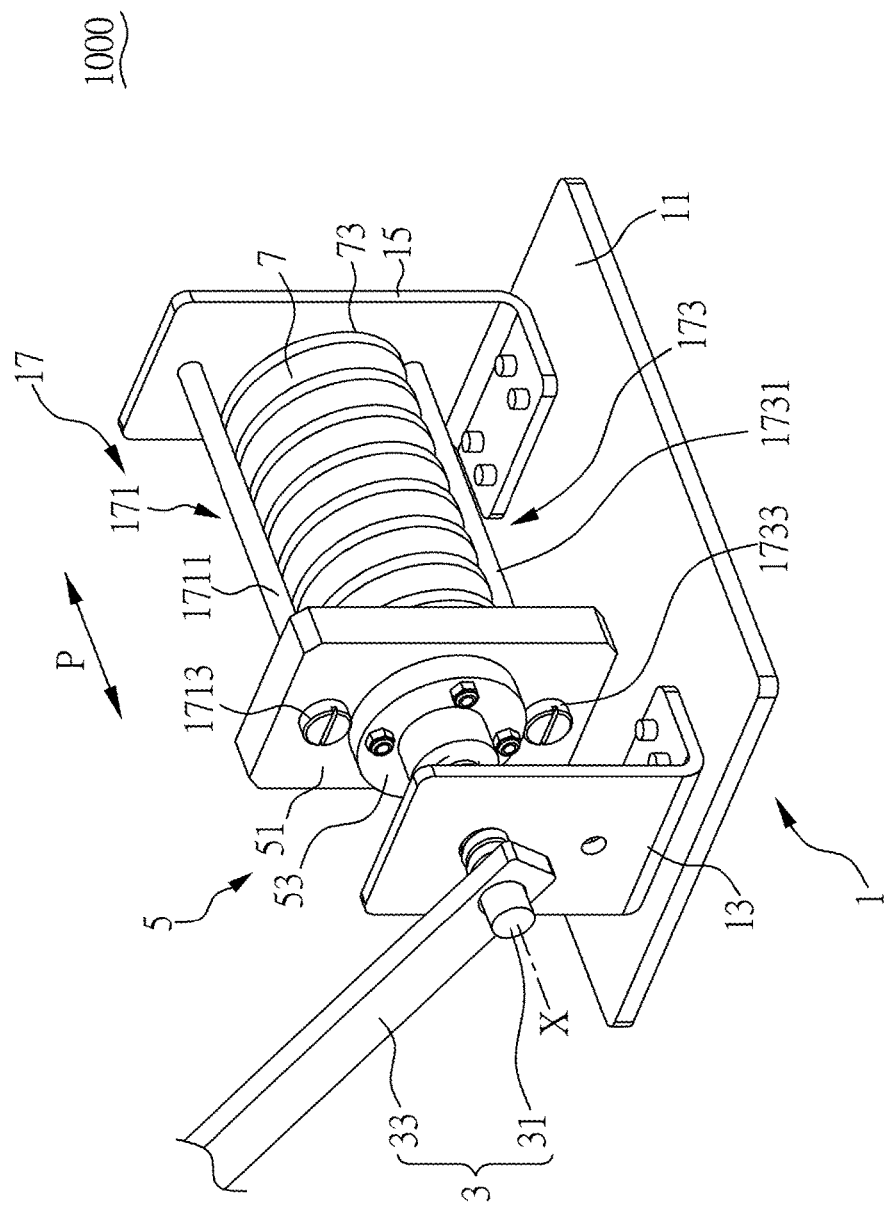
FIG. 1 is a perspective schematic view of a supporting module in accordance with one embodiment of the present invention.
Figure 2:
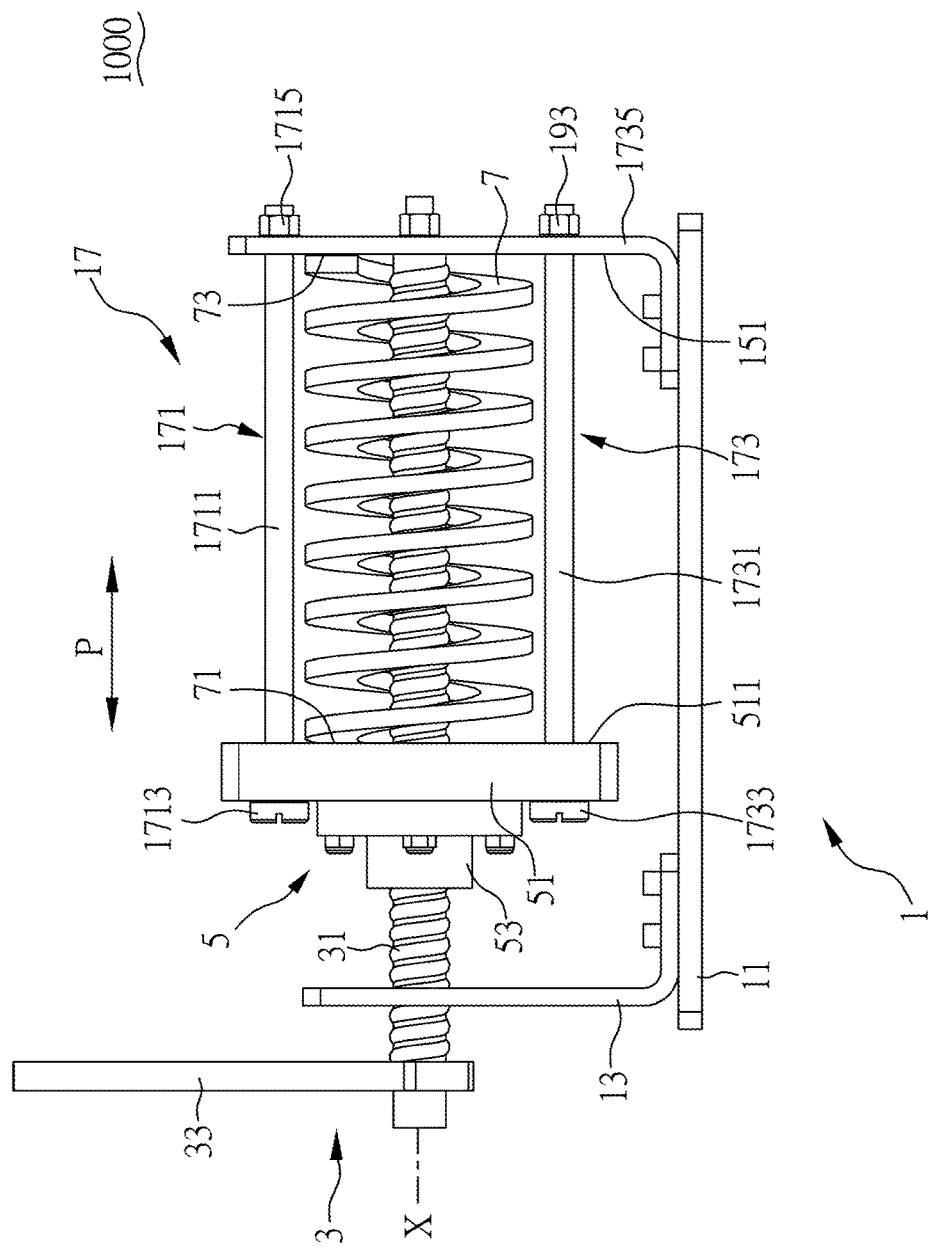
FIG. 2 is a side view of a supporting module in accordance with one embodiment of the present invention.
Figure 3:
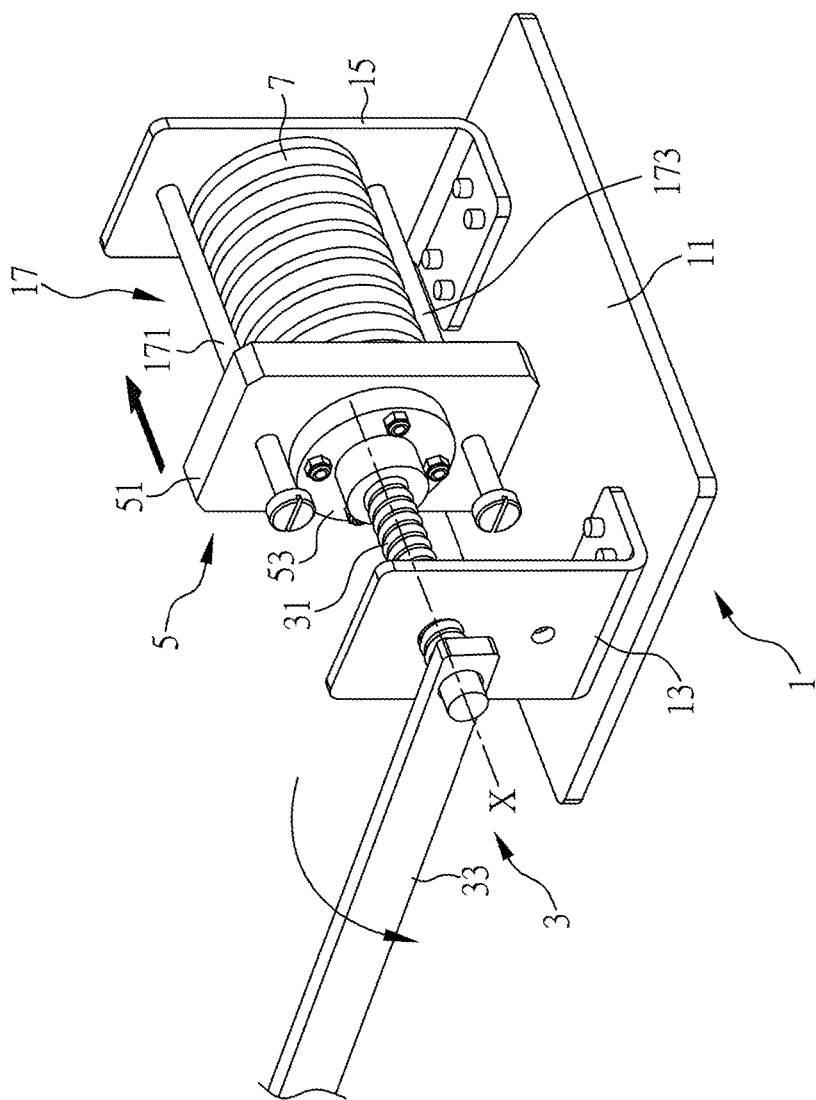
FIG. 3 is a perspective schematic view of a supporting module in which its arm is downwardly pivoted to a horizontal position in accordance with one embodiment of the present invention.
Figure 5:
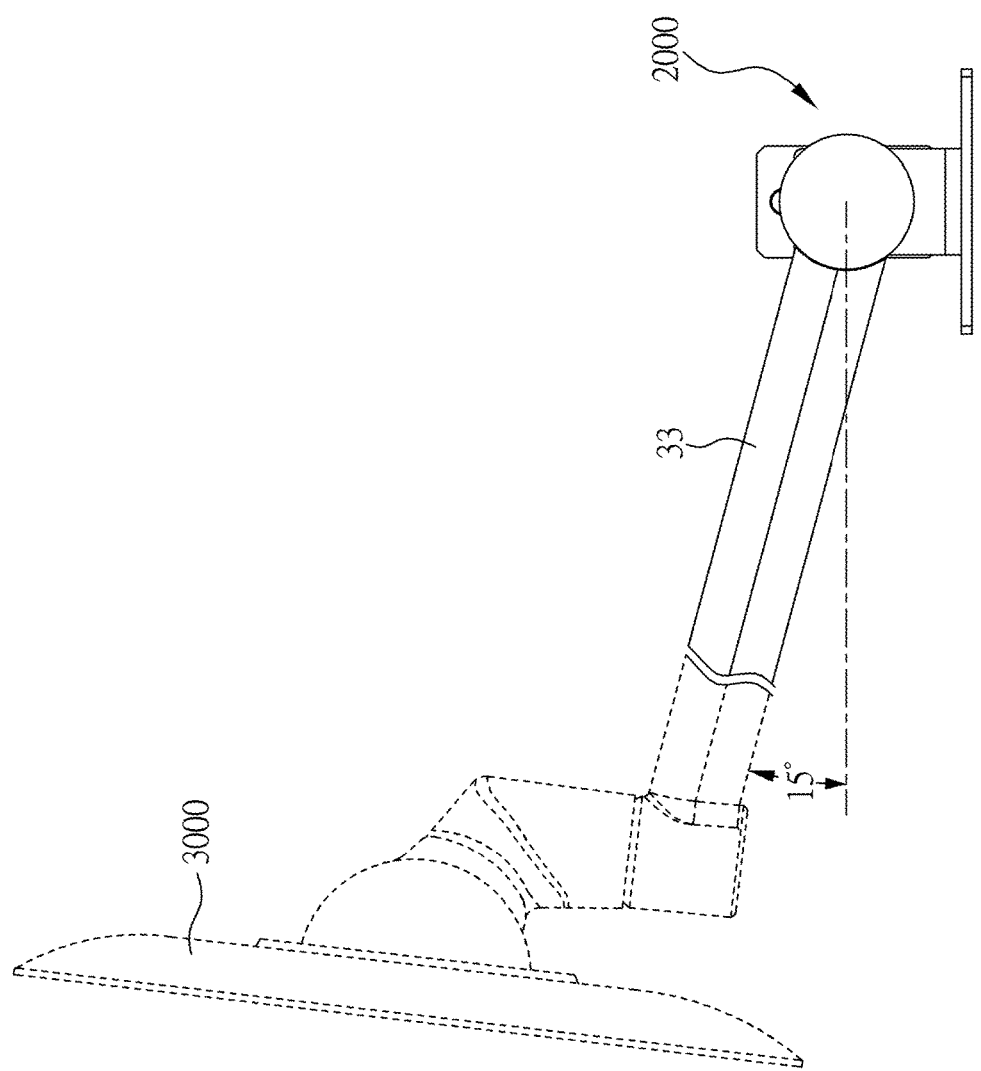
FIG. 5 is a side view of a display device on the supporting module adjusted to a higher position in accordance with one embodiment of the present invention.

Please refer to FIGS. 1 and 2, which are perspective schematic and side views of a supporting module 1000 in accordance with one embodiment of the present invention. The supporting module 1000 of this embodiment includes a fixing seat 1, a pivot lever 3, a slider 5 and a spring 7. The pivot lever 3 is pivotally fastened to the fixing seat 1 and configured to hold a display device 3000 (as shown in FIG. 5). The slider 5 and the spring 7 are sleeved on a shaft 31 of the pivot lever 3. In this embodiment, a compression spring is used for exemplary illustration of the spring 7. As shown in FIG. 3, the present invention is characterized in that the slider 5 threadedly connected to the pivot lever 3 would be brought into linear movement along the shaft 31 of the pivot lever 3 by pivoting an arm 33 of the pivot lever 3. By the displacement of the slider 5, the spring 7 is forced into different degrees of elastic deformation and provides different elastic forces on the slider 5, resulting in different resistance torques on the pivot lever 3. Accordingly, when the display device 3000 is lowered and the pivot lever 3 is pressed downwardly, the torque caused by the weight of the display device 3000 would increase due to the increased effective moment arm. In the meanwhile, the spring 7 provides larger resistance torque resulted from increased deformation of the spring 7 so as to balance the increased torque caused by the display device 3000. As a result, the display device 3000 can remain at any desired height.

The detailed structure of the supporting module 1000 and the association among main components in accordance with the present invention are further illustrated as follows.

The fixing seat 1 has a base plate 11, a first lateral plate 13, a second lateral plate 15 and a guide structure 17. The first lateral plate 13 and the second lateral plate 15 are fastened and erected on the base plate 11. The guide structure 17 includes a first guide rod 171 and a second guide rod 173, which are parallel to each other, extending through the slider 5, and fastened to the second lateral plate 15 to define a linear path P. In this embodiment, screws are used for exemplary illustration of the first guide rod 171 and the second guide rod 173. The first guide rod 171 has a shaft portion 1711, a head portion 1713 and a nut 1715. Likewise, the second guide rod 173 has a shaft portion 1731, a head portion 1733 and a nut 1735. The shaft portion 1711 of the first guide rod 171 and the shaft portion 1731 of the second guide rod 173 extend through the slider 5 and the second lateral plate 15 to define the linear path P for the slider 5. The second lateral plate 15 is affixed to the ends of the shaft portions 1711, 1731 through the nuts 1715, 1735, whereas the head portions 1713, 1733 are located at the other ends of the shaft portions 1711, 1731. The diameters of the head portions 1713, 1733 are larger than those of the shaft portions 1711, 1731. As a result, the head portions 1713, 1733 can stop the slider 5 departing from the first guide rod 171 and the second guide rod 173 in the direction toward the first lateral plate 13. By adjusting the relative location of the nuts 1715, 1735 on the shaft portions 1711, 1731, the length of the shaft portions 1711, 1731 between the first lateral plate 13 and the second lateral plate 15 can be changed. Accordingly, the preload of the spring 5 can be adjusted by the change in the distance between the second lateral plate 15 and the slider 5. However, the nut-fixing manner described in this embodiment is only provided for exemplary illustration, and the first guide rod 171 and the second guide rod 173 may be affixed to the second lateral plate 15 by any other connecting manner Additionally, the guide structure 17 of the fixing seat 1 is used for limiting the motion of the slider 5 along the linear path P. As a result, the guide structure 17 of the fixing seat 1 is not restricted to the screws illustrated as an exemplary aspect of the guide structure 17, and may be any other element or structure (such as spindle or linear guide track) for defining the linear path P.

The pivot lever 3 has a shaft 31 and an arm 33. The shaft 31 extends through the first lateral plate 13, the slider 5, the spring 7 and the second lateral plate 15 in sequence. The arm 33 has one end connected to the shaft 31 and the other end for connecting with the display device 3000 (as shown in FIG. 5). The shaft 31 is rotatably connected to the first lateral plate 13 and the second lateral plate 15 of the fixing seat 1. Further, a central axis X of the shaft 31 is parallel to the linear path P. Accordingly, when the display device 3000 is adjusted to higher or lower positions, the arm 33 would be brought into pivot motion about the central axis X of the shaft 31, synchronously with rotary motion of the shaft 31.

The slider 5 is sleeved on the shaft 31 and movably fastened to the guide structure 17 of the fixing seat 1. The slider 5 and the shaft 31 constitute a screw transmission mechanism. When the arm 33 is forced to bring the shaft 31 into rotary motion, the slider 5 would linearly move along the linear path P with respect to the shaft 31. For exemplary illustration, the shaft 31 is externally threaded, whereas the slider 5 includes a bearing plate 51 and a screwing part 53. The shaft 31 is threadedly connected to the internally threaded screwing part 53 and extends through the bearing plate 51, whereas the spring 7 abuts against the bearing plate 51. The connection between the bearing plate 51 and the screwing part 53 is not limited to the screw-locking manner exemplarily illustrated in this embodiment. The bearing plate 51 and the screwing part 53 may be fastened to each other by any other connecting means, or be integrated into one-piece component. Additionally, the screw transmission mechanism of the present invention is not limited to the design of an external thread being threadedly engaged with an internal thread, and may be any other type of screw transmission mechanism (such as ball-screw transmission).

The spring 7 is sleeved on the shaft 31 and located between a bearing face 511 of the slider 5 and an abutting face 151 of the second lateral plate 15. Specifically, the spring 7 has a mobile end 71 in contact with the bearing face 511 of the slider 5 and an immobile end 73 in contact with the abutting face 151 of the second lateral plate 15. During displacement of the slider 5 along the linear path P, the mobile end 71 can move with the slider 5, whereas the immobile end 73 keeps stationary. As a result, the displacement of the slider 5 would cause different degrees of deformation of the spring 7, resulting in different spring resilience forces on the slider 5. Further, by the screw transmission mechanism constituted by the pivot lever 3 and the slider 5, the different spring resilience forces can be converted into different resistance torques to balance the downward torque caused by the weight of the display device 3000. In this embodiment, the bearing face 511 of the slider 5 and the abutting face 151 of the second lateral plate 15 each have a larger area than a cross-sectional area (in the plane normal to the central axis X) of the spring 7. Accordingly, the mobile end 71 and the immobile end 73 of the spring 7 can firmly abut against the bearing plate 51 of the slider 5 and the second lateral plate 15 of the fixing seat 1.

Figure 4:
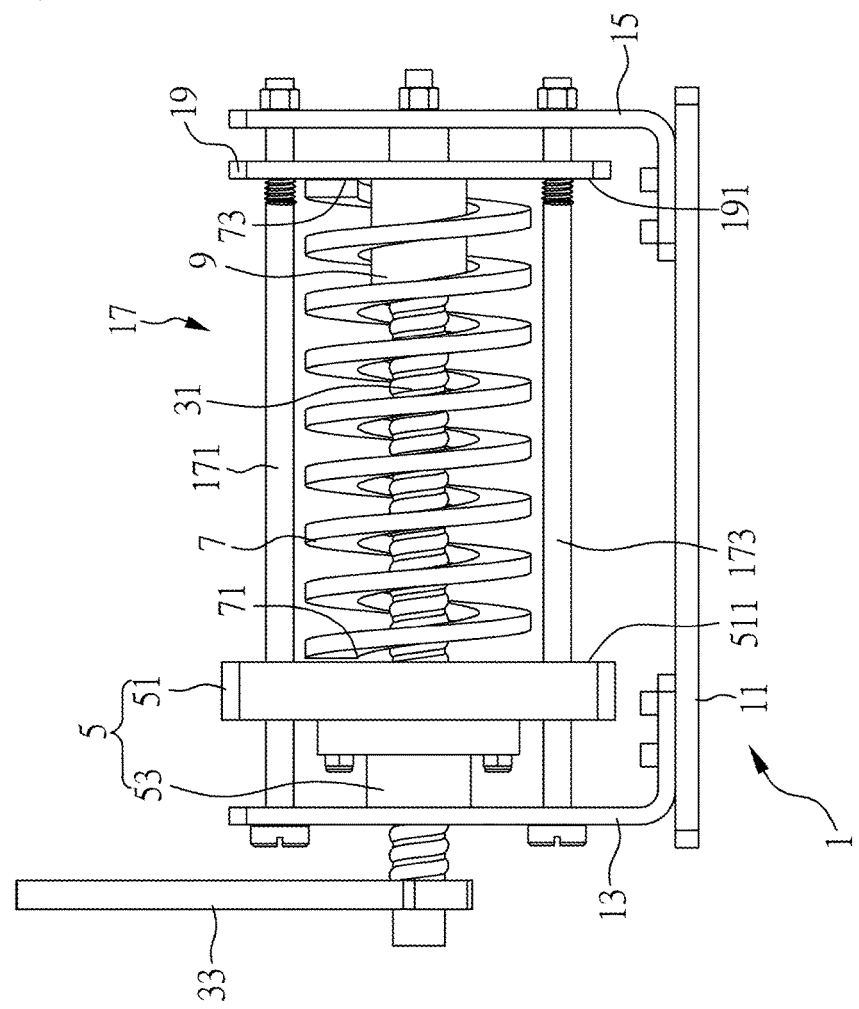
FIG. 4 is a side view of a supporting module in accordance with another embodiment of the present invention.

FIG. 4 is a side view of a supporting module 2000 in accordance with another embodiment of the present invention. The supporting module 2000 of this embodiment is similar to the above supporting module 1000, except that (i) the supporting module 2000 further includes a sleeve 9 sleeved on the shaft 31, (ii) the fixing seat 1 further has a third lateral plate 19 between the second lateral plate 15 and the spring 7, and (iii) the first guide rod 171 and the second guide rod 173 further extend to the first lateral plate 13 along the central axis X of the shaft 31 and are connected to the first lateral plate 13, whereas the screwing part 53 of the slider 5 abuts against the first lateral plate 13. The shaft 31, the first guide rod 171 and the second guide rod 173 extend through the third lateral plate 19. The mobile end 71 and the immobile end 73 of the spring 7 abut against the bearing plate 51 and the third lateral plate 19 and contact the bearing face 511 of the slider 5 and an abutting face 191 of the third lateral plate 19, respectively. The sleeve 9 between the shaft 31 and the spring 7 abuts against the third lateral plate 19 of the fixing seat 1. In this embodiment, the bearing face 511 and the abutting face 191 each has an area larger than the cross-sectional area of the spring 7. Accordingly, the spring 7 can be firmly disposed between the slider 5 and the third lateral plate 19. Further, the exterior surface of the sleeve 9 abuts against the interior surface of the spring 7 so as to avoid swaying of the spring 7. In this embodiment, since two opposite ends of the first guide rod 171 and the second guide rod 173 are connected to immobile members (namely, the first lateral plate 13 and the second lateral plate 15), the structural stability can be enhanced. Preferably, the first guide rod 171 and the second guide rod 173 are rotatably connected to the first lateral plate 13 and the second lateral plate 15, and threadedly connected to the third lateral plate 19. Accordingly, when the first guide rod 171 and the second guide rod 173 are rotating, the relative position of the third lateral plate 19 with respect to the first guide rod 171 and the second guide rod 173 can be adjusted through the internal and external threads engaged with each other. As a result, the preload of the spring 5 can be adjusted by the change in the distance between the third lateral plate 19 and the slider 5.

Alternatively, for convenience in adjusting the preload of the spring 5, only one of the first guide rod 171 and the second guide rod 173 is threadedly connected to the third lateral plate 19.

Figure 6:
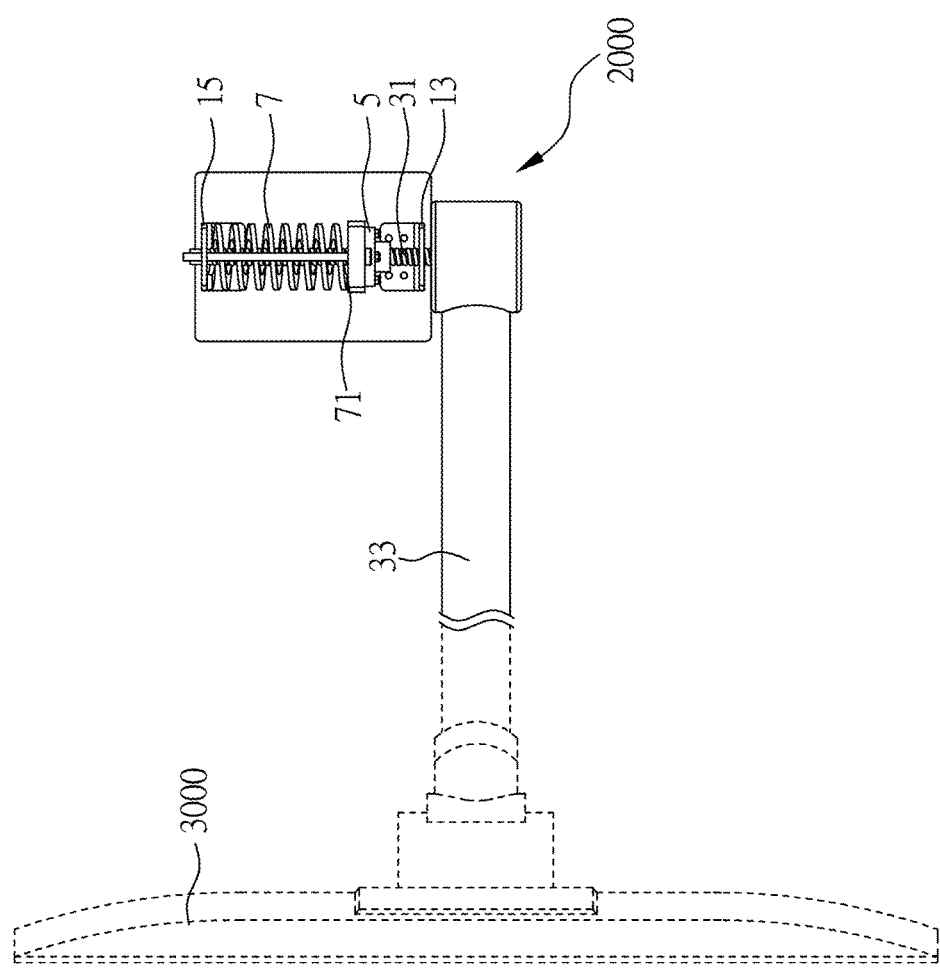
FIG. 6 is a top view of a display device on the supporting module adjusted to a higher position in accordance with one embodiment of the present invention.

Attention is now directed to FIGS. 5 and 6, which are side and top views of the display device 3000 on the arm 33 adjusted to a higher position, respectively. When the display device 3000 is lifted, the upwardly pivoted arm 33 would bring the shaft 31 into screw motion with respect to the slider 5, resulting in the movement of the slider 5 toward the first lateral plate 13. Accordingly, by the resilience force of the spring 7, the mobile end 71 of the spring 7 abutting against the slider 5 would move synchronously with the slider 5 toward the first lateral plate 13, and thus the spring 7 returns to its less compressed state.

Figure 7:
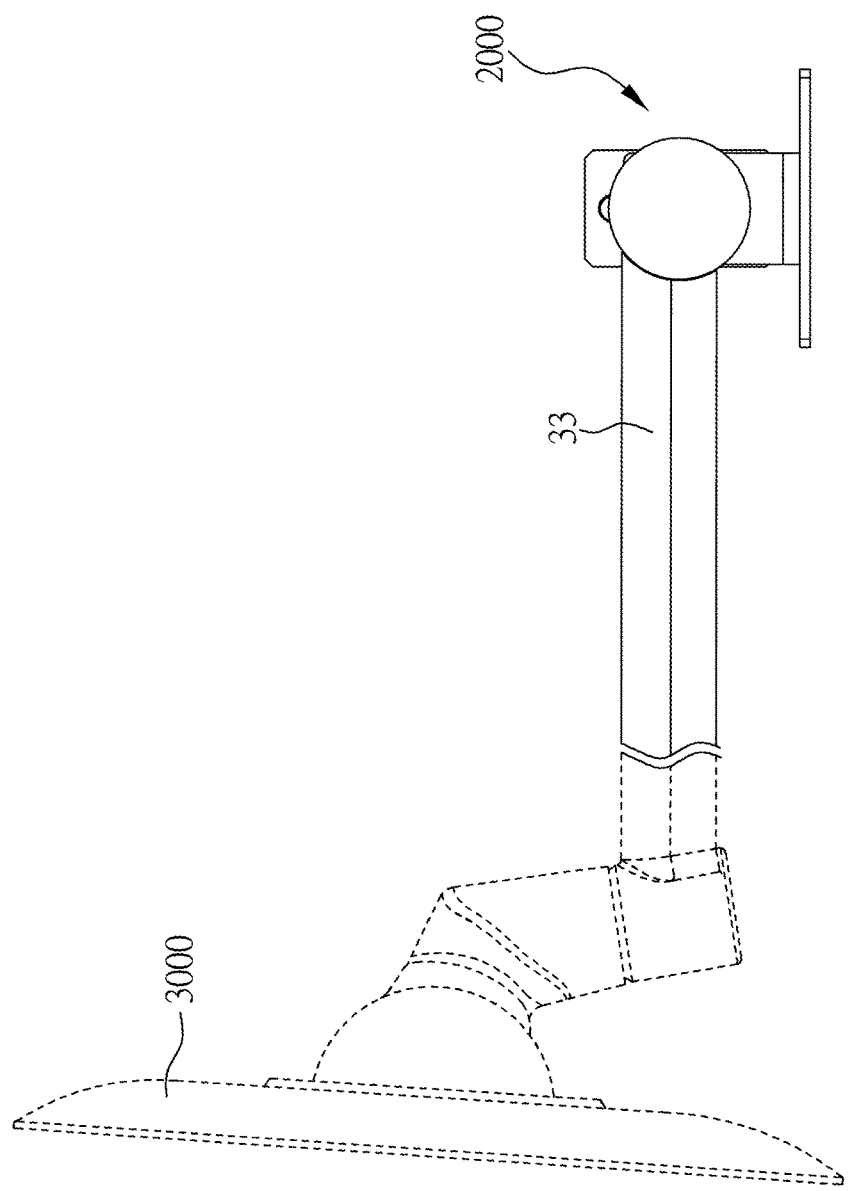
FIG. 7 is a side view of a display device on the supporting module lowered to a horizontal position in accordance with one embodiment of the present invention.
Figure 8:
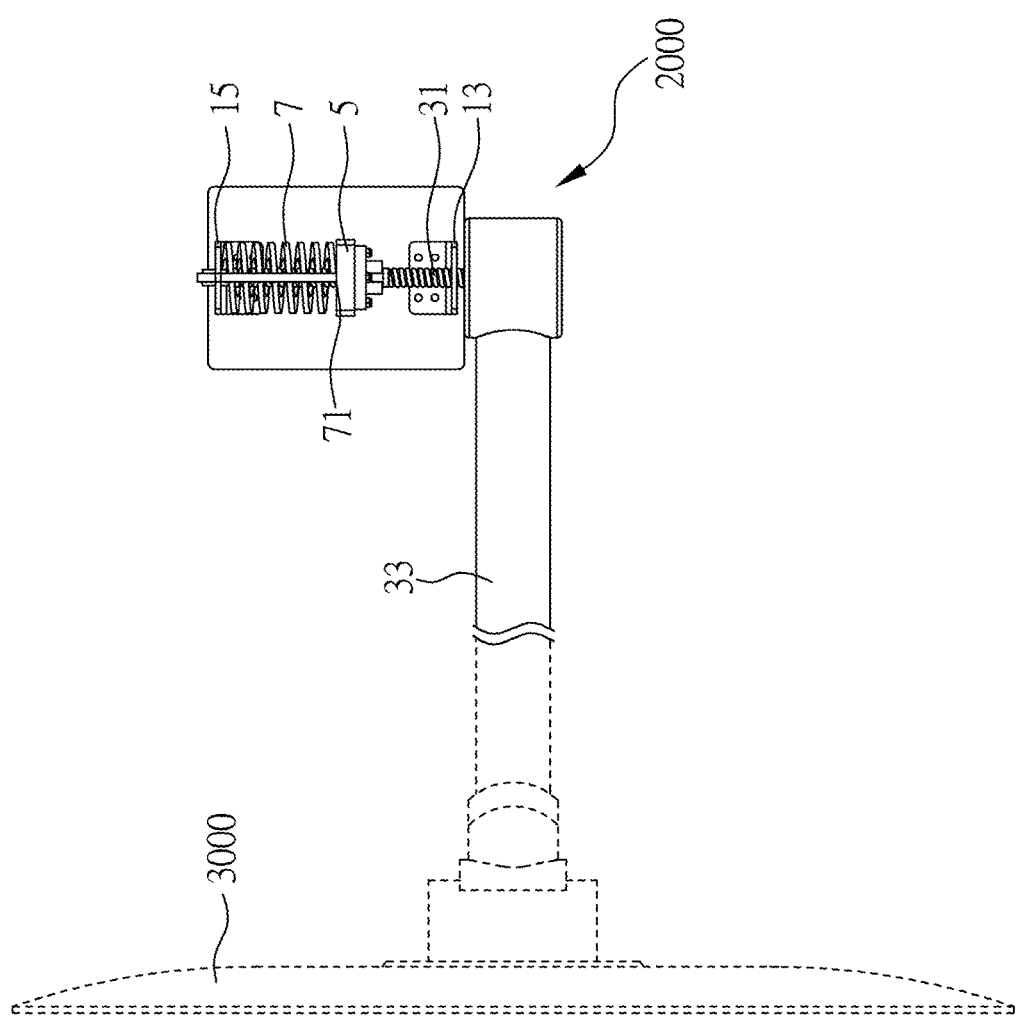
FIG. 8 is a top view of a display device on the supporting module lowered to a horizontal position in accordance with one embodiment of the present invention.

On the contrary, please refer to FIGS. 7 and 8, which are side and top views of the display device 3000 on the arm 33 lowered to a horizontal position, respectively. When the display device 3000 is pressed downwardly, the downwardly pivoted arm 33 would cause screw motion between the shaft 31 and the slider 5 and drive the slider 5 to move toward the second lateral plate 15 with respect to the shaft 31. Accordingly, the mobile end 71 of the spring 7 abutting against the slider 5 is compressed toward the second lateral plate 15, resulting in a more compressed state of the spring 7.

The aforementioned operation range of the arm 33 between the horizontal position and 15° lifted-up position is only provided for exemplary explanation, and the supporting module of the present invention is not limited thereto. The lifting and lowering limits of the arm 33 may be varied according to practical requirement. For instance, the supporting module may be configured to have an operation range between 15° and −5°.

In brief, when the arm of the supporting module in accordance with the present invention is operated from a horizontal state to a lifted-up state, the downward torque caused by the weight of the display device would decrease due to the reduced effective moment arm, and the reduced deformation of the spring results in smaller resistance torque for balancing with the downward torque. Accordingly, the display device can be stopped at any desired height.

The above examples are intended for illustrating the embodiments of the subject invention and the technical features thereof, but not for restricting the scope of protection of the subject invention. Many other possible modifications and variations can be made without departing from the spirit and scope of the invention as hereinafter claimed. The scope of the subject invention is based on the claims as appended.

What is claimed is:

1. A supporting module for a display device, the supporting module comprising:
    a fixing seat, having a guide structure, wherein the guide structure defines a linear path;
    a pivot lever, having a shaft and an arm, wherein (i) the shaft is rotatably connected to the fixing seat and has a central axis parallel to the linear path, (ii) the arm is connected to the shaft and used for mounting the display device, and (iii) the arm is configured to be pivotable about the central axis of the shaft so as to bring the shaft into rotary motion;
    a slider, being sleeved on the shaft, wherein a screw transmission mechanism is constituted by the slider and the shaft, and the slider is brought into linear movement along the linear path with respect to the shaft when the arm is forced to induce the rotary motion of the shaft; and
    a spring, having a mobile end and an immobile end, wherein the mobile end moves with the slider and the immobile end keeps stationary when the slider moves along the linear path, so that the linear movement of the slider causes different degrees of deformation in the spring, resulting in different spring resilience forces on the slider, and the different spring resilience forces are further converted into different resistance torques through the screw transmission mechanism so as to stop the display device at any desired height.

2. The supporting module of claim 1, wherein the shaft is externally threaded and the slider is internally threaded, and the shaft and the slider are threadedly connected to each other, so as to constitute the screw transmission mechanism.

3. The supporting module of claim 1, wherein the spring is a compression spring.

4. The supporting module of claim 3, wherein the slider has a bearing face in contact with the mobile end of the spring, and the bearing face has a larger area than a cross-sectional area of the spring.

5. The supporting module of claim 4, wherein (i) the slider includes a screwing part and a bearing plate, (ii) the shaft is threadedly connected to the screwing part and extends through the bearing plate, and (iii) the mobile end of the spring abuts against the bearing plate.

6. The supporting module of claim 1, further comprising a sleeve sleeved on the shaft and having an exterior surface abutting against an internal surface of the spring.

7. The supporting module of claim 1, wherein the deformation of the spring is reduced when the arm is pivoted to decrease effective moment arm.

8. The supporting module of claim 1, wherein (i) the fixing seat further has a base plate, a first lateral plate and a second lateral plate, (ii) the first lateral plate and the second lateral plate are erected on the base plate, and (iii) the shaft extends through the first lateral plate, the slider, the spring and the second lateral plate in sequence, and is rotatably connected to the first lateral plate and the second lateral plate.

9. The supporting module of claim 8, wherein the mobile end and the immobile end of the spring abut against the slider and the second lateral plate of the fixing seat, respectively.

10. The supporting module of claim 9, wherein the second lateral plate has an abutting face in contact with the immobile end of the spring, and the abutting face has a larger area than the cross-sectional area of the spring.

11. The supporting module of claim 8, wherein the guide structure of the fixing seat includes a first guide rod and a second guide rod, and the first guide rod and the second guide rod extend through the slider along a direction parallel to the central axis of the shaft and are connected to the second lateral plate to permit the linear movement of the slider along the first guide rod and the second guide rod.

12. The supporting module of claim 11, wherein (i) the fixing seat further has a third lateral plate between the second lateral plate and the spring, (ii) the shaft, the first guide rod and the second guide rod extend through the third lateral plate, and (iii) the mobile end and the immobile end of the spring abut against the slider and the third lateral plate, respectively.

13. The supporting module of claim 12, wherein the third lateral plate has an abutting face in contact with the immobile end of the spring, and the abutting face has a larger area than the cross-sectional area of the spring.

14. The supporting module of claim 12, wherein at least one of the first guide rod and the second guide rod is rotatably connected to the first lateral plate and the second lateral plate and threadedly connected to the third lateral plate, and preload of the spring is adjustable by rotating at least one of the first guide rod and the second guide rod.

15. The supporting module of claim 11, wherein (i) each of the first guide rod and the second guide rod has a shaft portion and a head portion, (ii) the shaft portions extend through the slider, and (iii) each of the head portion has a diameter larger than that of the shaft portions to stop the slider departing from the first guide rod and the second guide rod in a direction toward the first lateral plate.

16. The supporting module of claim 11, wherein the first guide rod and the second guide rod extend to and are connected to the first lateral plate of the fixing seat.

17. The supporting module of claim 15, wherein (i) each of the first guide rod and the second guide rod further has a nut, (ii) the shaft portions are affixed to the second lateral plate of the fixing seat through the nuts, and (iii) preload of the spring is adjustable by changing relative location of the nuts on the shaft portions.

* * * * *